(12) United States Patent
Guillermo et al.

(10) Patent No.: US 8,293,584 B2
(45) Date of Patent: Oct. 23, 2012

(54) INTEGRATED CIRCUIT PACKAGE SYSTEM WITH FILLED WAFER RECESS

(75) Inventors: Dennis Guillermo, Singapore (SG); Sheila Rima C. Magno, Singapore (SG); Ma. Shirley Asoy, Singapore (SG); Pandi Chelvam Marimuthu, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 358 days.

(21) Appl. No.: 11/462,509

(22) Filed: Aug. 4, 2006

(65) Prior Publication Data

US 2008/0029847 A1 Feb. 7, 2008

(51) Int. Cl.
*H01L 21/00* (2006.01)

(52) U.S. Cl. ........ 438/114; 438/113; 438/125; 438/126; 257/684; 257/707; 257/787; 257/E21.238; 257/E21.503

(58) Field of Classification Search .................. 438/110, 438/113, 458, 462, 108, 112, 124, 127, 460, 438/114, 125, 126, 465; 257/E21.596, E21.599, 257/678, 684, 704, 707, 730, 787, E21.214, 257/E21.237, E21.238, E21.503, E29.022
See application file for complete search history.

(56) References Cited

U.S. PATENT DOCUMENTS

| | | | |
|---|---|---|---|
| 6,023,094 A | 2/2000 | Kao et al. | |
| 6,338,980 B1 | 1/2002 | Satoh | |
| 6,399,463 B1 * | 6/2002 | Glenn et al. | 438/463 |
| 6,784,530 B2 * | 8/2004 | Sugaya et al. | 257/686 |
| 6,830,959 B2 * | 12/2004 | Estacio | 438/113 |
| 6,838,748 B2 | 1/2005 | Ishio et al. | |
| 7,056,812 B2 | 6/2006 | Derderian et al. | |
| 7,064,010 B2 | 6/2006 | Farnworth et al. | |
| 7,321,168 B2 * | 1/2008 | Tao | 257/734 |
| 7,514,291 B2 * | 4/2009 | Akram | 438/110 |
| 2006/0051938 A1 * | 3/2006 | Connell et al. | 438/460 |
| 2006/0244137 A1 * | 11/2006 | Kikuchi et al. | 257/734 |

* cited by examiner

*Primary Examiner* — Eduardo A Rodela
(74) *Attorney, Agent, or Firm* — Ishimaru & Associates LLP; Mikio Ishimaru; Stanley M. Chang

(57) ABSTRACT

An integrated circuit package system is provided including forming a wafer having a back side and an active side, forming a recess in the wafer from the back side, forming a cover in the recess, and singulating the wafer at the recess filled with the cover.

20 Claims, 9 Drawing Sheets

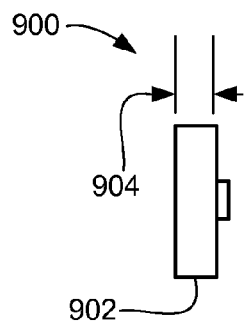
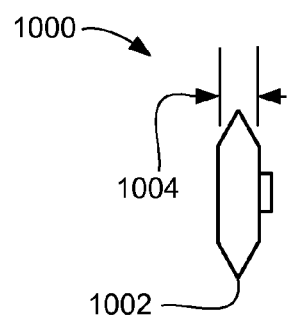
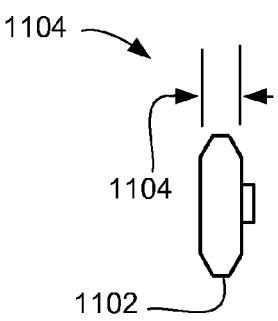
FIG. 9  FIG. 10  FIG. 11
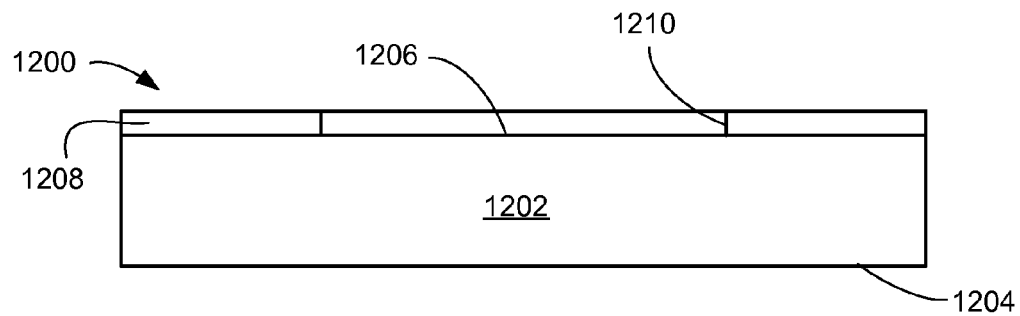
FIG. 12
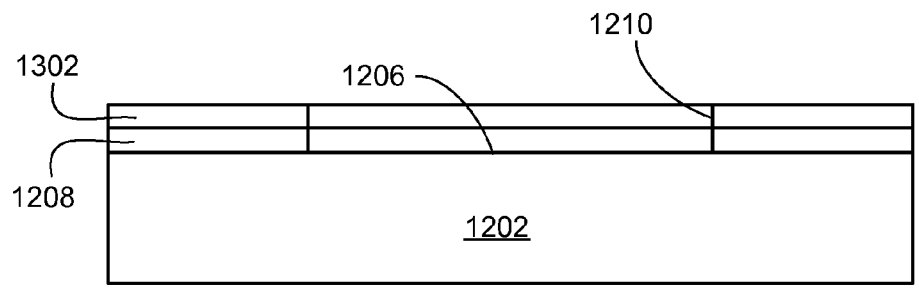
FIG. 13
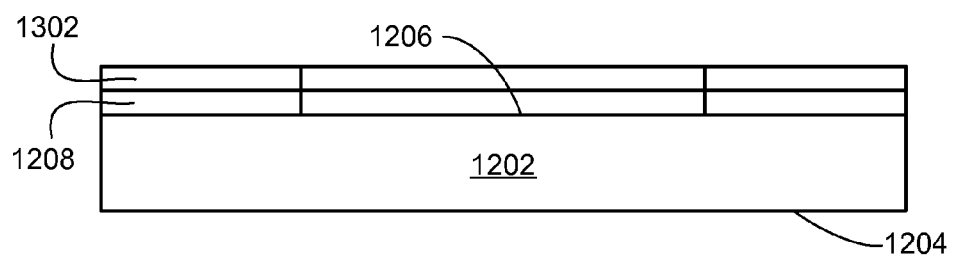
FIG. 14

INTEGRATED CIRCUIT PACKAGE SYSTEM WITH FILLED WAFER RECESS

TECHNICAL FIELD

The present invention relates generally to integrated circuit packages and more particularly to molded integrated circuit packages.

BACKGROUND ART

Modern electronics, such as smart phones, personal digital assistants, location based services devices, enterprise class servers, or enterprise class storage arrays, are packing more integrated circuits into an ever shrinking physical space with expectations for decreasing cost. Contemporary electronics expose integrated circuits and packages to more demanding and sometimes new environmental conditions, such as cold, heat, and humidity requiring integrated circuit packages to provide robust structures.

Numerous technologies have been developed to meet these requirements. Some of the research and development strategies focus on new technologies while others focus on improving the existing and mature technologies. Research and development in the existing technologies may take a myriad of different directions.

One of these technologies involves making the integrated circuits as thin as possible. Thinning the wafers and integrated circuits provide lower height integrated circuit stacks and packages. As the thinning process evolves to more aggressive "thinness" of the wafers and the integrated circuits, the thinned integrated circuits are more prone to damage throughout the silicon manufacturing and packaging processes.

Integrated circuit wafers are fabricated to be as thin as possible through processes such as thinning, grinding, or lapping. Some of these processes are applied to the wafers prior to fabricating the integrated circuits on the wafers while others occur afterwards. These processes are applied to the wafers after fabricating the wafers including forming electrical interconnect, such as solder bumps, on the wafer. The thin wafers are prone to bowing, warping, cracking or breaking due to many factors including the thinness of the wafers. The wafers and the resultant integrated circuit dice are damage from the singulation process. The wafer may be damaged, individual integrated circuit die may be damaged, or chipping or cracking of the integrated circuit die may result.

Numerous approaches attempting to solve the wafer and integrated circuits damage exist. Some of the approaches try to solve these problems through additional physical structures on the active side or back side of the wafer. Although these structures alleviate damage, they also require additional physical space upon the resulting integrated circuits and wafer. Alternative solutions may remove this protective structure prior to manufacturing the final integrated circuit packaged product. This adds manufacturing complexity, lowers yield, and increases cost.

Thus, a need still remains for an integrated circuit package system providing low cost manufacturing, reduced form factor, and improved reliability for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a wafer having a back side and an active side, forming a recess in the wafer from the back side, forming a cover in the recess, and singulating the wafer at the recess filled with the cover.

Certain embodiments of the invention have other aspects in addition to or in place of those mentioned or obvious from the above. The aspects will become apparent to those skilled in the art from a reading of the following detailed description when taken with reference to the accompanying drawings.

BRIEF DESCRIPTION OF THE DRAWINGS

FIG. 9 is a cross-sectional view of a first blade for the manufacture of the present invention;

FIG. 10 is a cross-sectional view of a second blade for the manufacture of the present invention;

FIG. 11 is a cross-sectional view of a third blade for the manufacture of the present invention;

FIG. 12 is a cross-sectional view of a wafer structure in an embodiment of the present invention;

FIG. 13 is the structure of FIG. 12 in a redistribution formation phase;

FIG. 14 is the structure of FIG. 13 in a grinding phase;

BEST MODE FOR CARRYING OUT THE INVENTION

Figure 1:
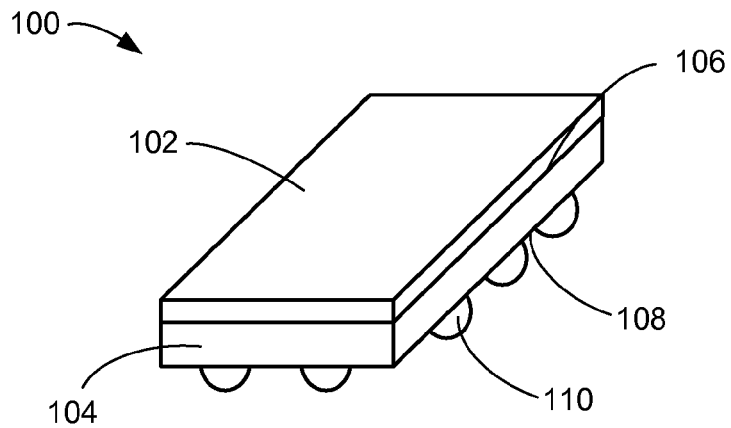
FIG. 1 is a perspective view of an integrated circuit package system having a planar cover in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a perspective view of an integrated circuit package system 100 having a planar cover 102 in an embodiment of the present invention. The integrated circuit package system 100, such as a flip chip, has an integrated circuit die 104 having a back side 106 and an active side 108. An interconnect 110, such as a solder ball, is on the active side 108. The planar cover 102, such as protective layer of molding compound, semi-liquid material, or low viscous material, covers the back side 106.

Figure 2:
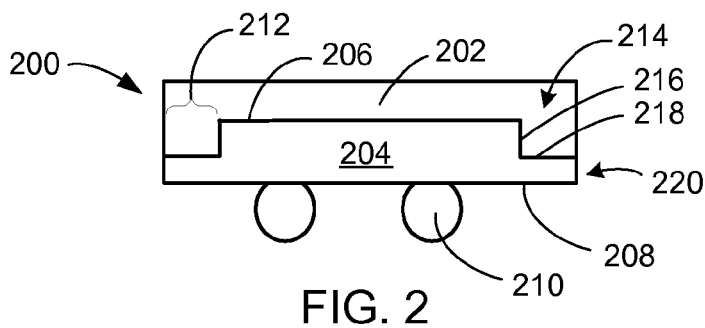
FIG. 2 is a cross-sectional view of an integrated circuit package system having a planar cover in an embodiment of the present invention.

Referring now to FIG. 2, therein is shown a cross-sectional view of an integrated circuit package system 200 having a planar cover 202 in an embodiment of the present invention. The integrated circuit package system 200 may represent the integrated circuit package system 100 of FIG. 1. An integrated circuit die 204 may represent the integrated circuit die 104 of FIG. 1. The integrated circuit die 204 has a back side 206 and an active side 208. An interconnect 210, such as solder balls. The planar cover 202 may represent the planar cover 102 of FIG. 1.

A peripheral region 212 of the back side 206 has a notch 214 from the back side 206 into the integrated circuit die 204 but not traversing to or adversely affecting the active side 208. The notch 214 has a rectangular configuration with a vertical segment 216 and a recessed level 218.

The planar cover 202 covers the back side 206 to an edge 220 of the integrated circuit die 204 and fills the notch 214 exclusively and completely with the planar cover 202. The planar cover 202 provides planar rigidity of the integrated circuit die 204 as well as helps prevent damage, such as chipping or cracking along the edge 220, during manufacturing.

Figure 3:
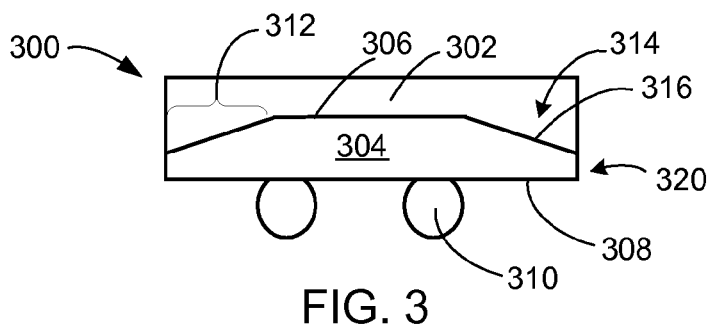
FIG. 3 is a cross-sectional view of an integrated circuit package system having a planar cover in an alternative embodiment of the present invention.

Referring now to FIG. 3, therein is shown a cross-sectional view of an integrated circuit package system 300 having a planar cover 302 in an alternative embodiment of the present invention. The integrated circuit package system 300 may represent the integrated circuit package system 100 of FIG. 1. An integrated circuit die 304 may represent the integrated circuit die 104 of FIG. 1. The integrated circuit die 304 has a back side 306 and an active side 308. An interconnect 310, such as solder balls. The planar cover 302 may represent the planar cover 102 of FIG. 1.

A peripheral region 312 of the back side 306 has a groove 314 from the back side 306 into the integrated circuit die 304 but not traversing to or adversely affecting the active side 308. The groove 314 has an angled configuration having a sloped segment 316 from the back side 306 to an edge 320 of the integrated circuit die 304.

The planar cover 302 covers the back side 306 to the edge 320 of the integrated circuit die 304 and fills the groove 314 exclusively and completely with the planar cover 302. The planar cover 302 provides planar rigidity of the integrated circuit die 304 as well as helps prevent damage, such as chipping or cracking along the edge 320, during manufacturing.

Figure 4:
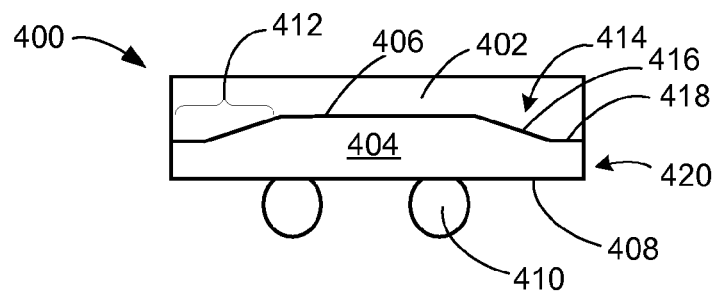
FIG. 4 is a cross-sectional view of an integrated circuit package system having a planar cover in another embodiment of the present invention.

Referring now to FIG. 4, therein is shown a cross-sectional view of an integrated circuit package system 400 having a planar cover 402 in another embodiment of the present invention. The integrated circuit package system 400 may represent the integrated circuit package system 100 of FIG. 1. An integrated circuit die 404 may represent the integrated circuit die 104 of FIG. 1. The integrated circuit die 404 has a back side 406 and an active side 408. An interconnect 410, such as solder balls. The planar cover 402 may represent the planar cover 102 of FIG. 1.

A peripheral region 412 of the back side 406 has a notched groove 414 from the back side 406 into the integrated circuit die 404 but not traversing to or adversely affecting the active side 408. The notched groove 414 has an angled configuration having a sloped segment 416 and a recessed level 418 from the back side 406 to an edge 420 of the integrated circuit die 404.

The planar cover 402 covers the back side 406 to the edge 420 of the integrated circuit die 404 and fins the notched groove 414 exclusively and completely with the planar cover 402. The planar cover 402 provides planar rigidity of the integrated circuit die 404 as well as helps prevent damage, such as chipping or cracking along the edge 420, during manufacturing.

Figure 5:
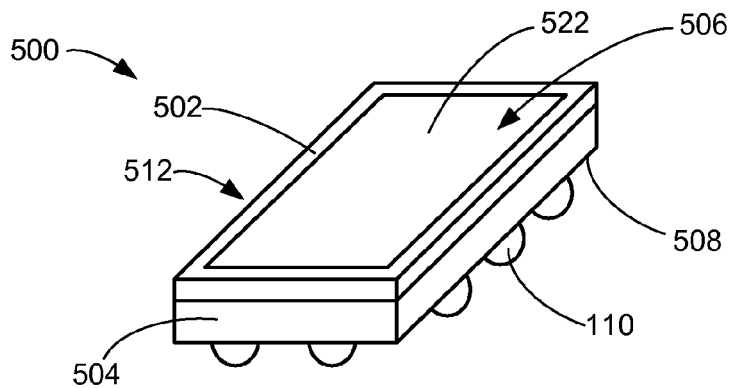
FIG. 5 is a perspective view of an integrated circuit package system having a partial cover in yet another alternative embodiment of the present invention.

Referring now to FIG. 5, therein is shown a perspective view of an integrated circuit package system 500 having a partial cover 502 in yet another alternative embodiment of the present invention. The integrated circuit package system 500, such as a flip chip, has an integrated circuit die 504 having a back side 506 and an active side 508. An interconnect 510, such as a solder ball, is on the active side 508. The partial cover 502, such as protective layer of molding compound, semi-solid material, or film material, covers a peripheral region 512 of the back side 506 and a central region 522 of the back side 506 exposed. The central region 522 may be used to dissipate heat.

Figure 6:
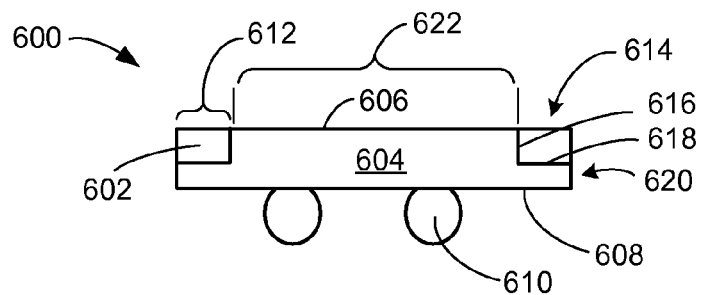
FIG. 6 is a cross-sectional view of an integrated circuit package system having a partial cover in yet another alternative embodiment of the present invention.

Referring now to FIG. 6, therein is shown a cross-sectional view of an integrated circuit package system 600 having a partial cover 602 in yet another alternative embodiment of the present invention. The integrated circuit package system 600 may represent the integrated circuit package system 500 of FIG. 5. An integrated circuit die 604 may represent the integrated circuit die 504 of FIG. 5. The integrated circuit die 604 has a back side 606 and an active side 608. An interconnect 610, such as solder balls. The partial cover 602 may represent the partial cover 502 of FIG. 5.

A peripheral region 612 of the back side 606 has a notch 614 from the back side 606 into the integrated circuit die 604 but not traversing to or adversely affecting the active side 608. The notch 614 has a rectangular configuration with a vertical segment 616 and a recessed level 618.

The partial cover 602 fills the notch 614 exclusively and completely with the partial cover 602, providing planar rigidity to the integrated circuit die 604 from the peripheral region 612 as well as helps prevent damage, such as chipping or cracking along an edge 620 of the integrated circuit package system 600, during manufacturing. A central region 622 of the back side 606 is exposed to ambient.

Figure 7:
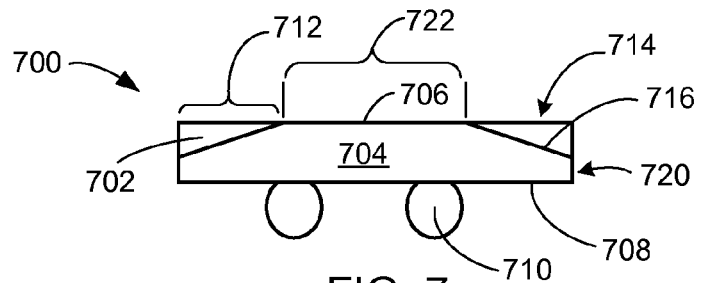
FIG. 7 is a cross-sectional view of an integrated circuit package system having a partial cover in yet another alternative embodiment of the present invention.

Referring now to FIG. 7, therein is shown a cross-sectional view of an integrated circuit package system 700 having a partial cover 702 in yet another alternative embodiment of the present invention. The integrated circuit package system 700 may represent the integrated circuit package system 500 of FIG. 5. An integrated circuit die 704 may represent the integrated circuit die 504 of FIG. 5. The integrated circuit die 704 has a back side 706 and an active side 708. An interconnect 710, such as solder balls. The partial cover 702 may represent the partial cover 502 of FIG. 5.

A peripheral region 712 of the back side 706 has a groove 714 from the back side 706 into the integrated circuit die 704 but not traversing to or adversely affecting the active side 708. The groove 714 has an angled configuration having a sloped segment 716 from the back side 706 to an edge 720 of the integrated circuit die 704.

The partial cover 702 fills the groove 714 exclusively and completely with the partial cover 702, providing planar rigidity to the integrated circuit die 704 from the peripheral region 712 as well as helps prevent damage, such as chipping or cracking along the edge 720 of the integrated circuit package system 700, during manufacturing. A central region 722 of the back side 706 is exposed to ambient.

Figure 8:
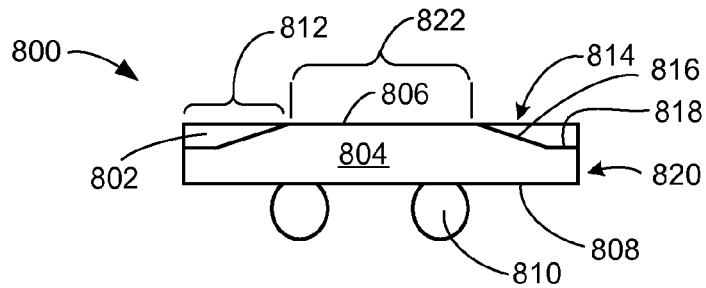
FIG. 8 is a cross-sectional view of an integrated circuit package system having a partial cover in yet another alternative embodiment of the present invention.

Referring now to FIG. 8, therein is shown a cross-sectional view of an integrated circuit package system 800 having a partial cover 802 in yet another alternative embodiment of the present invention. The integrated circuit package system 800 may represent the integrated circuit package system 500 of FIG. 5. An integrated circuit die 804 may represent the integrated circuit die 504 of FIG. 5. The integrated circuit die 804 has a back side 806 and an active side 808. An interconnect 810, such as solder balls. The partial cover 802 may represent the partial cover 502 of FIG. 5.

A peripheral region 812 of the back side 806 has a notched groove 814 from the back side 806 into the integrated circuit die 804 but not traversing to or adversely affecting the active side 808. The notched groove 814 has an angled configuration having a sloped segment 816 and a recessed level 818 from the back side 806 to an edge 820 of the integrated circuit die 804.

The partial cover 802 fills the notched groove 814 exclusively and completely with the partial cover 802, providing planar rigidity to the integrated circuit die 804 from the peripheral region 812 as well as helps prevent damage, such as chipping or cracking along the edge 820 of the integrated circuit package system 800, during manufacturing. A central region 822 of the back side 806 is exposed to ambient.

Referring now to FIG. 9, therein is shown a cross-sectional view of a first blade 900 for the manufacture of the present invention. The first blade 900 has a rectangular blade edge 902 that may be used to form the notch 214 of FIG. 2. The first blade 900 has a blade width 904 larger than the width of the blade used for singulation.

Referring now to FIG. 10, therein is shown a cross-sectional view of a second blade 1000 for the manufacture of the present invention. The second blade 1000 has a pointed tip edge 1002 that may be used to form the groove 314 of FIG. 3. The second blade 1000 has a blade width 1004 larger than the width of the blade used for singulation.

Referring now to FIG. 11, therein is shown a cross-sectional view of a third blade 1100 for the manufacture of the present invention. The third blade 1100 has a blunted tip edge 1102 that may be used to form the notched groove 414 of FIG. 4. The third blade 1100 has a blade width 1104 larger than the width of the blade used for singulation.

Referring now to FIG. 12, therein is shown a cross-sectional view of a wafer structure 1200 in an embodiment of the present invention. The wafer structure 1200 has a wafer 1202 with a back side 1204 and an active side 1206 having circuitry (not shown) thereon. A metal layer 1208 is on the active side 1206 providing electrical connections at a predetermined pattern. A marker 1210 is also shown in the metal layer 1208.

Referring now to FIG. 13, therein is shown the structure of FIG. 12 in a redistribution formation phase. A redistribution layer 1302 (RDL) is formed over the metal layer 1208 and the active side 1206 of the wafer 1202. The redistribution layer 1302 may have additional circuit elements (not shown) and route the predetermined pattern from the metal layer 1208 to a different pattern. The redistribution layer 1302 may be more than one layer comprised of conductive and insulating layer at predetermined patterns. The marker 1210 from the metal layer 1208 also shows on the redistribution layer 1302.

Referring now to FIG. 14, therein is shown the structure of FIG. 13 in a grinding phase. The wafer 1202 undergoes a thinning process with a predetermined thickness of the wafer 1202 is removed from the back side 1204. The thinning process does not adversely affect the active side 1206, the metal layer 1208, and the redistribution layer 1302. The thinning process may be any number of processes, such as chemical and mechanical planarization (CMP).

Figure 15:
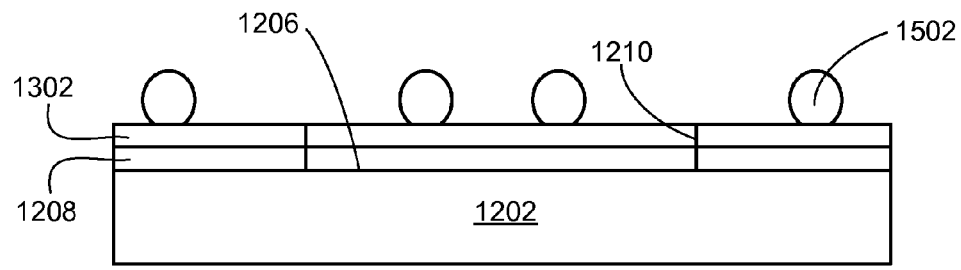
FIG. 15 is the structure of FIG. 14 in an interconnect formation phase.

Referring now to FIG. 15, therein is shown the structure of FIG. 14 in an interconnect formation phase. An interconnect 1502 is formed over the redistribution layer 1302 in a predetermined pattern. The interconnect 1502 is not formed on the marker 1210. The interconnect 1502 provides connectivity to the active side 1206 of the wafer 1202 through the redistribution layer 1302 and the metal layer 1208.

Figure 16:
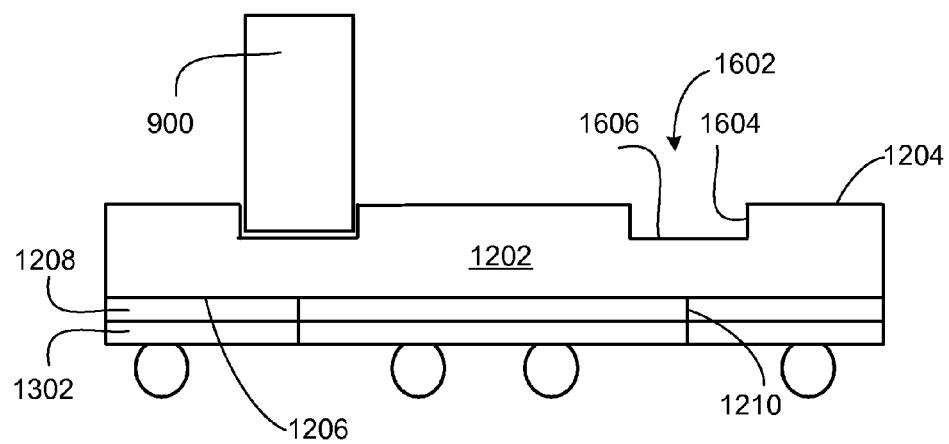
FIG. 16 is the structure of FIG. 15 in a notch formation phase.

Referring now to FIG. 16, therein is shown the structure of FIG. 15 in a notch formation phase. The first blade 900 forms a notch 1602 on the back side 1204 and substantially centered about the marker 1210 of the metal layer 1208 and the redistribution layer 1302 at the active side 1206 of the wafer 1202. The notch 1602 has vertical segments 1604 and a recessed level 1606. The notch 1602 may represent the notch 214 of FIG. 2 of the integrated circuit package system 200 of FIG. 2 or the notch 614 of FIG. 6 of the integrated circuit package system 600 of FIG. 6. For illustrative purposes, the notch 1602 is described formed by the first blade 900, although it is understood that the notch 1602 may be formed by any number of processes, such as laser scribing or plasma etching.

Figure 17:
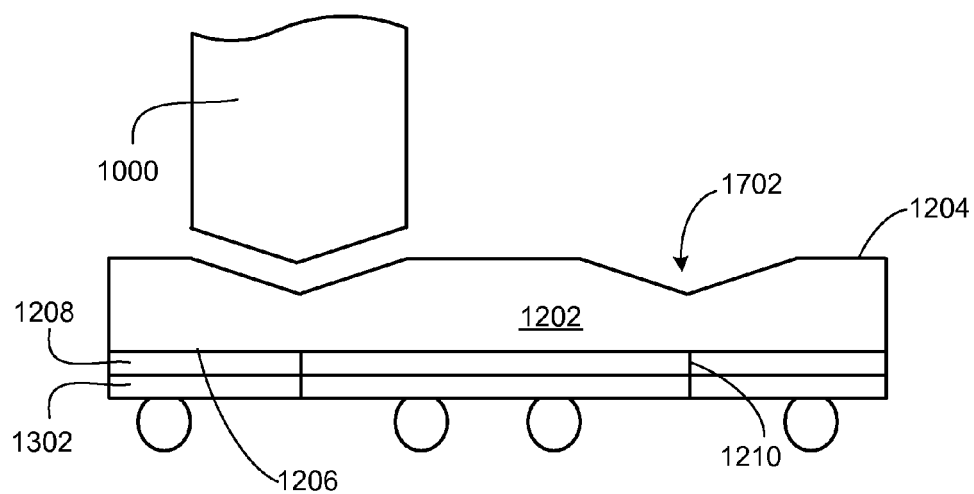
FIG. 17 is the structure of FIG. 15 in a groove formation phase.

Referring now to FIG. 17, therein is shown the structure of FIG. 15 in a groove formation phase. The second blade 1000 forms a groove 1702 on the back side 1204 and substantially centered about the marker 1210 of the metal layer 1208 and the redistribution layer 1302 at the active side 1206 of the wafer 1202. The groove 1702 has sloped segments (vertical segments 1604) converging substantially above the marker 1210. The groove 1702 may represent the groove 314 of FIG. 3 of the integrated circuit package system 300 of FIG. 3 or the groove 714 of FIG. 7 of the integrated circuit package system 700 of FIG. 7. For illustrative purposes, the groove 1702 is described formed by the first blade 900, although it is understood that the groove 1702 may be formed by any number of processes, such as laser scribing or plasma etching.

Figure 18:
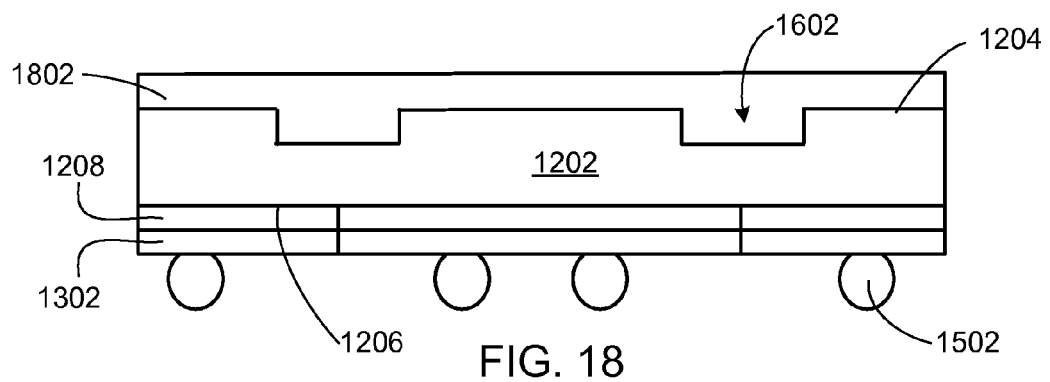
FIG. 18 is the structure of FIG. 16 in a planar cover formation phase.

Referring now to FIG. 18, therein is shown the structure of FIG. 16 in a planar cover formation phase. A planar cover 1802 is formed on the back side 1204 filling the notch 1602 exclusively and completely with the planar cover 1802. The planar cover 1802 may be formed by a number of processes, such as coating, spin coating, printing, or laminating. The material of the planar cover 1802 undergoes curing. The planar cover 1802 may also have identification marks placed thereon through a marking process, such as laser marking. The interconnect 1502, the redistribution layer 1302, the metal layer 1208, and the active side 1206 of the wafer 1202 are not adversely affected by the planar cover formation process.

Figure 19:
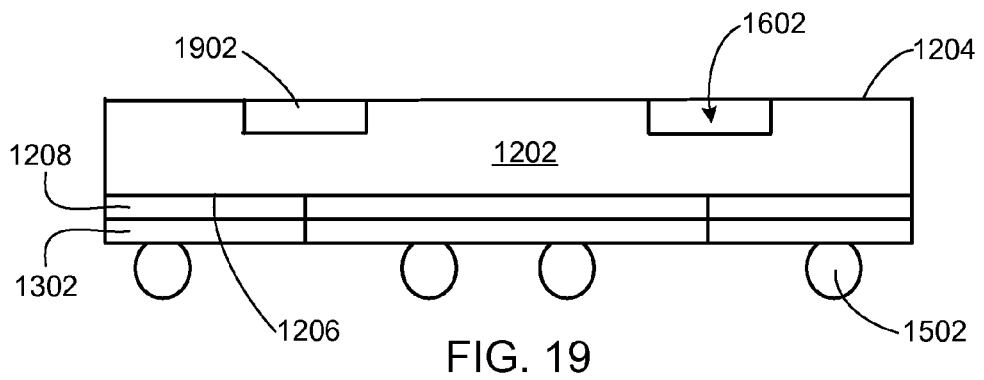
FIG. 19 is the structure of FIG. 16 in a partial cover formation phase.

Referring now to FIG. 19, therein is shown the structure of FIG. 16 in a partial cover formation phase. A partial cover 1902 is formed filling the notch 1602 exclusively and completely with the partial cover 1902 and exposing the rest of the back side 1204 to ambient. The partial cover 1902 may be formed by a number of processes, such as coating, spin coating, printing, or laminating. The material of the partial cover 1902 undergoes curing. Identification marks may be placed on the back side 1204 through a marking process, such as laser marking. The interconnect 1502, the redistribution layer 1302, the metal layer 1208, and the active side 1206 of the wafer 1202 are not adversely affected by the formation of the partial cover 1902.

Figure 20:
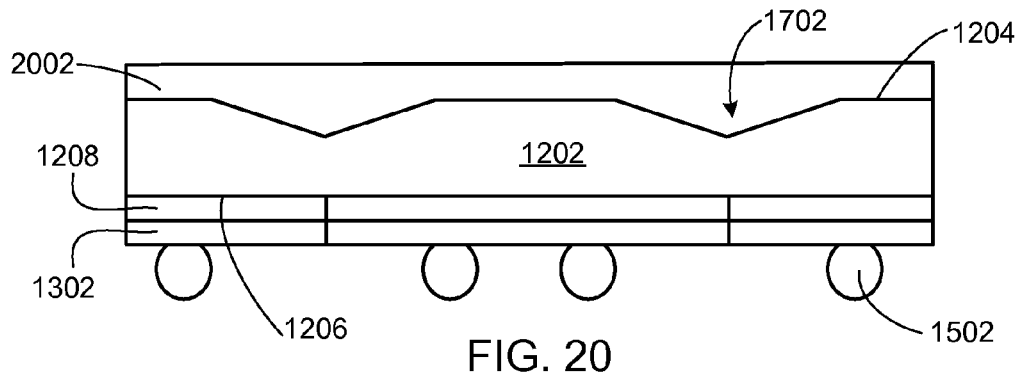
FIG. 20 is the structure of FIG. 17 in a planar cover formation phase.

Referring now to FIG. 20, therein is shown the structure of FIG. 17 in a planar cover formation phase. A planar cover 2002 is formed on the back side 1204 filling the groove 1702 exclusively and completely with the planar cover 2002. The planar cover 2002 may be formed by a number of processes, such as coating, spin coating, printing, or laminating. The material of the planar cover 2002 undergoes curing. The planar cover 2002 may also have identification marks placed thereon through a marking process, such as laser marking. The interconnect 1502, the redistribution layer 1302, the metal layer 1208, and the active side 1206 of the wafer 1202 are not adversely affected by the planar cover formation process.

Figure 21:
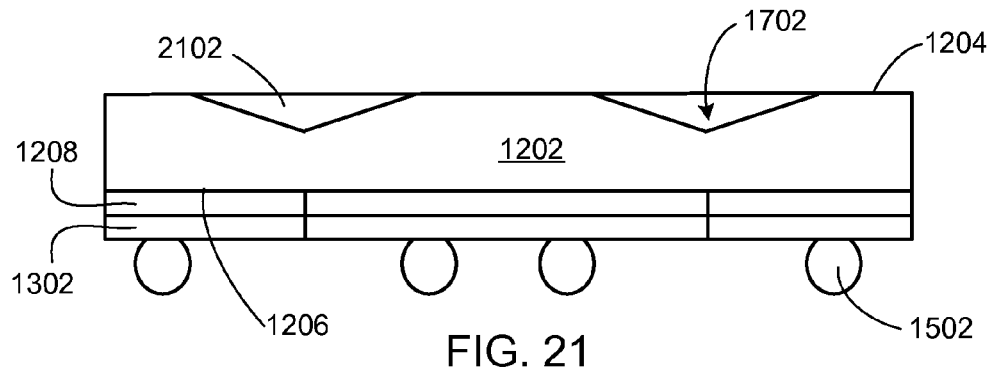
FIG. 21 is the structure of FIG. 17 in a partial cover formation phase.

Referring now to FIG. 21, therein is shown the structure of FIG. 17 in a partial cover formation phase. A partial cover 2102 is formed filling the groove 1702 exclusively and completely with the partial cover 2102 and exposing the rest of the back side 1204 to ambient. The partial cover 2102 may be formed by a number of processes, such as coating, spin coating, printing, or laminating. The material of the partial cover 2102 undergoes curing. Identification marks may be placed on the back side 1204 through a marking process, such as laser marking. The interconnect 1502, the redistribution layer 1302, the metal layer 1208, and the active side 1206 of the wafer 1202 are not adversely affected by the formation of the partial cover 2102.

Figure 22:
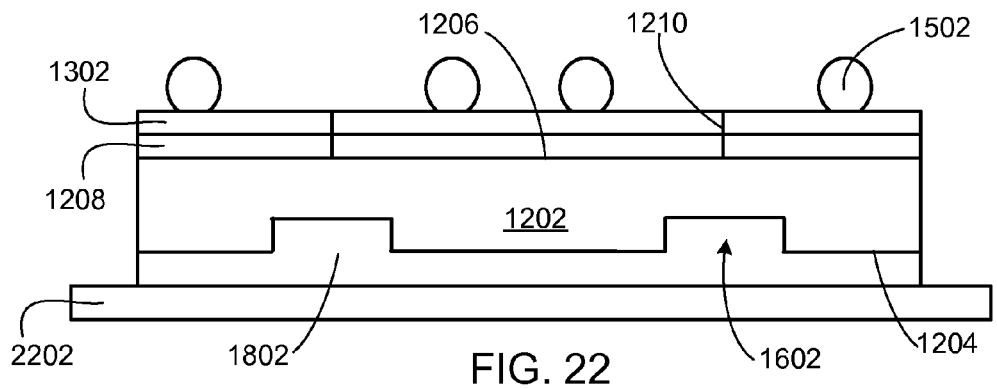
FIG. 22 is the structure of FIG. 18 in a wafer mount phase.

Referring now to FIG. 22, therein is shown the structure of FIG. 18 in a wafer mount phase. The wafer 1202 is placed on a tape 2202, such as a saw or dicing tape, with the planar cover 1802 on the tape 2202. The back side 1204 and the notch 1602 are encapsulated by the planar cover 1802. The metal layer 1208 is above the active side 1206 and below the redistribution layer 1302. The interconnect 1502 is above the redistribution layer 1302 and not directly above the marker 1210.

Figure 23:
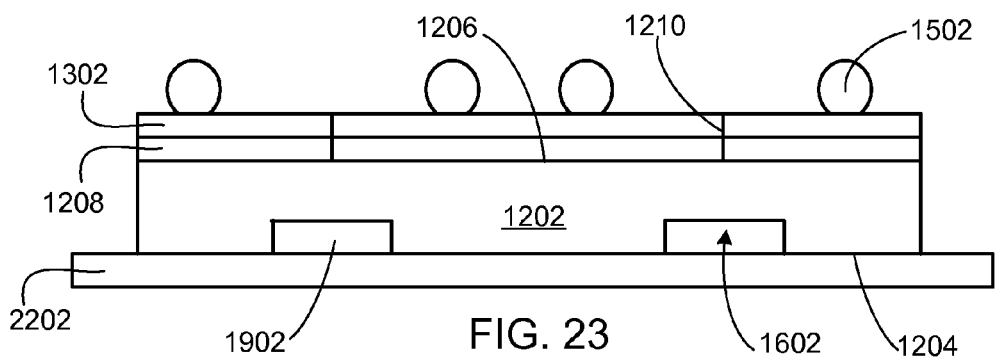
FIG. 23 is the structure of FIG. 19 in a wafer mount phase.

Referring now to FIG. 23, therein is shown the structure of FIG. 19 in a wafer mount phase. The wafer 1202 is placed on the tape 2202, such as a saw or dicing tape, with the back side 1204 and the partial cover 1902, filling the notch 1602, on the tape 2202. The metal layer 1208 is above the active side 1206 and below the redistribution layer 1302. The interconnect 1502 is above the redistribution layer 1302 and not directly above the marker 1210.

Figure 24:
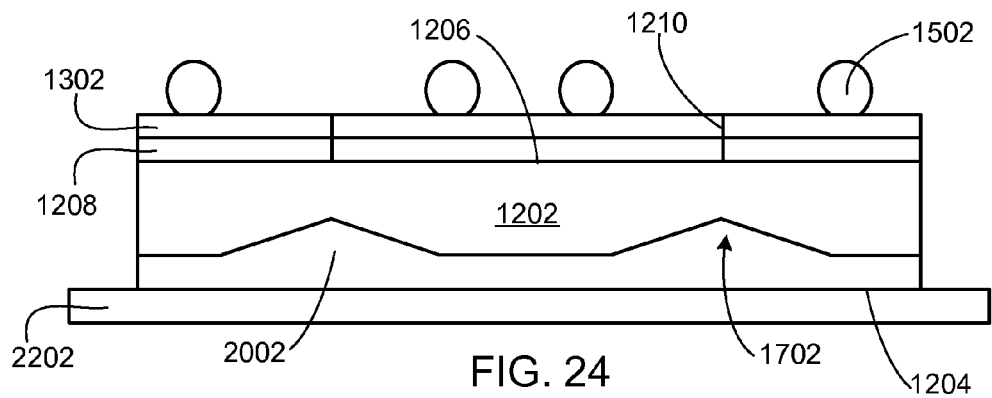
FIG. 24 is the structure of FIG. 20 in a wafer mount phase.

Referring now to FIG. 24, therein is shown the structure of FIG. 20 in a wafer mount phase. The wafer 1202 is placed on the tape 2202, such as a saw or dicing tape, with the planar cover 2002 on the tape 2202. The back side 1204 and the groove 1702 are encapsulated by the planar cover 2002. The metal layer 1208 is above the active side 1206 and below the redistribution layer 1302. The interconnect 1502 is above the redistribution layer 1302 and not directly above the marker 1210.

Figure 25:
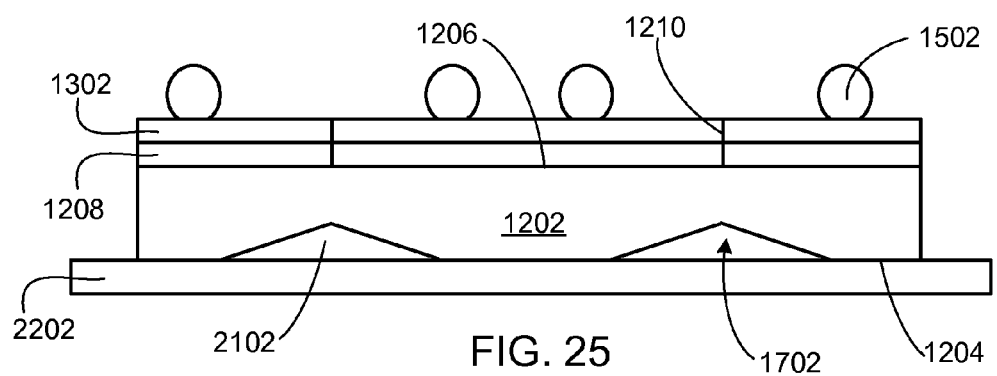
FIG. 25 is the structure of FIG. 21 in a wafer mount phase.

Referring now to FIG. 25, therein is shown the structure of FIG. 21 in a wafer mount phase. The wafer 1202 is placed on the tape 2202, such as a saw or dicing tape, with the back side 1204 and the partial cover 2102, filling the groove 1702, on the tape 2202. The metal layer 1208 is above the active side 1206 and below the redistribution layer 1302. The interconnect 1502 is above the redistribution layer 1302 and not directly above the marker 1210.

Figure 26:
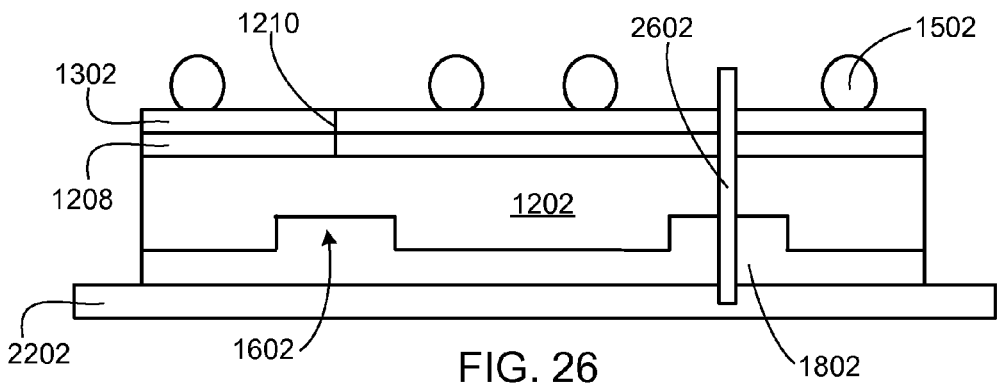
FIG. 26 is the structure of FIG. 22 in a singulation phase.

Referring now to FIG. 26, therein is shown the structure of FIG. 22 in a singulation phase. A singulation blade 2602 dices the wafer 1202 on the tape 2202. The singulation blade 2602 cuts the wafer 1202 at the location identified by the marker 1210 without contacting the interconnect 1502. The singulation blade 2602 cuts from the redistribution layer 1302 through the metal layer 1208 continuing through the wafer 1202 and the planar cover 1802. The notch 1602 filled exclusively and completely with the planar cover 1802 is approximately bisected. The planar cover 1802 and the notch 1602 filled with the planar cover 1802 substantially eliminates cracking or chipping that previously existed from the singulation process. The singulation blade 2602 leaves the tape 2202 sufficiently intact for the singulation process.

Figure 27:
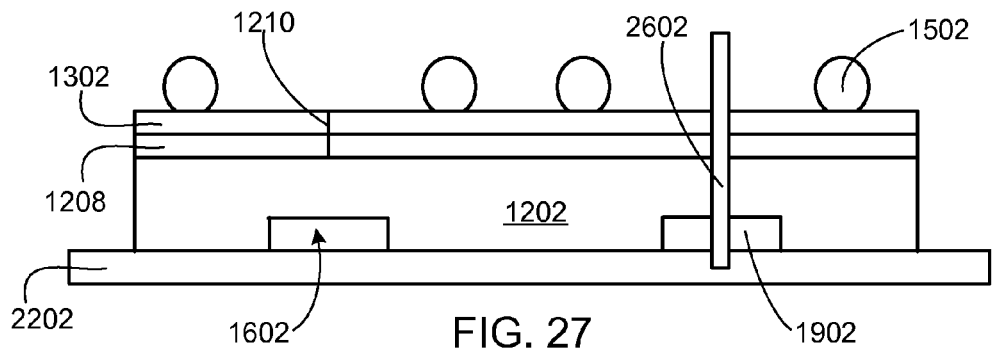
FIG. 27 is the structure of FIG. 23 in a singulation phase.

Referring now to FIG. 27, therein is shown the structure of FIG. 23 in a singulation phase. The singulation blade 2602 dices the wafer 1202 on the tape 2202. The singulation blade 2602 cuts the wafer 1202 at the location identified by the marker 1210 without contacting the interconnect 1502. The singulation blade 2602 cuts from the redistribution layer 1302 through the metal layer 1208 continuing through the wafer 1202 and the partial cover 1902 filling the notch 1602. The notch 1602 filled exclusively and completely with the partial cover 1902 is approximately bisected. The notch 1602 filled with the partial cover 1902 substantially eliminates cracking or chipping that previously existed from the singulation process. The singulation blade 2602 leaves the tape 2202 sufficiently intact for the singulation process.

Figure 28:
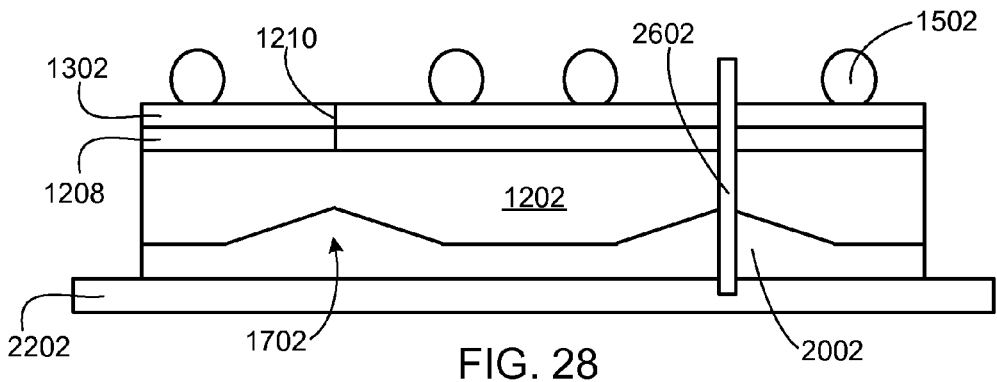
FIG. 28 is the structure of FIG. 24 in a singulation phase.

Referring now to FIG. 28, therein is shown the structure of FIG. 24 in a singulation phase. The singulation blade 2602 dices the wafer 1202 on the tape 2202. The singulation blade 2602 cuts the wafer 1202 at the location identified by the marker 1210 without contacting the interconnect 1502. The singulation blade 2602 cuts from the redistribution layer 1302 through the metal layer 1208 continuing through the wafer 1202 and the planar cover 2002. The groove 1702 filled exclusively and completely with the planar cover 2002 is approximately bisected. The planar cover 2002 and the groove 1702 filled with the planar cover 2002 substantially eliminates cracking or chipping that previously existed from the singulation process. The singulation blade 2602 leaves the tape 2202 sufficiently intact for the singulation process.

Figure 29:
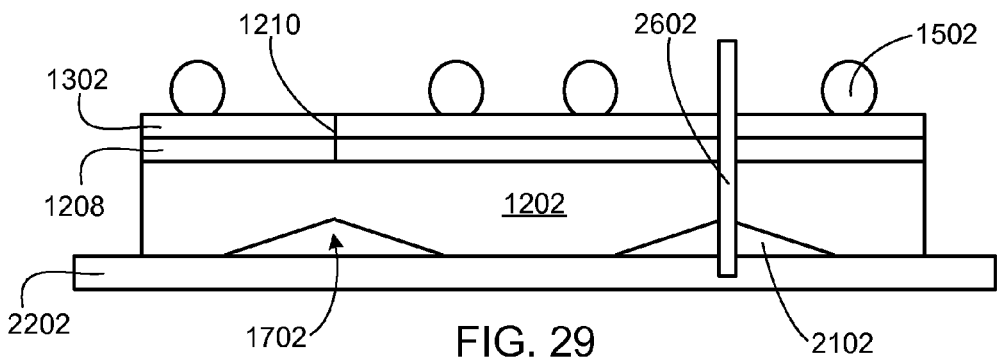
FIG. 29 is the structure of FIG. 25 in a singulation phase.

Referring now to FIG. 29, therein is shown the structure of FIG. 25 in a singulation phase. The singulation blade 2602 dices the wafer 1202 on the tape 2202. The singulation blade 2602 cuts the wafer 1202 at the location identified by the marker 1210 without contacting the interconnect 1502. The singulation blade 2602 cuts from the redistribution layer 1302 through the metal layer 1208 continuing through the wafer 1202 and the partial cover 2102 filling the groove 1702. The groove 1702 filled exclusively and completely with the partial cover 2102 is approximately bisected. The groove 1702 filled with the partial cover 2102 substantially eliminates cracking or chipping that previously existed from the singulation process. The singulation blade 2602 leaves the tape 2202 sufficiently intact for the singulation process.

Figure 30:
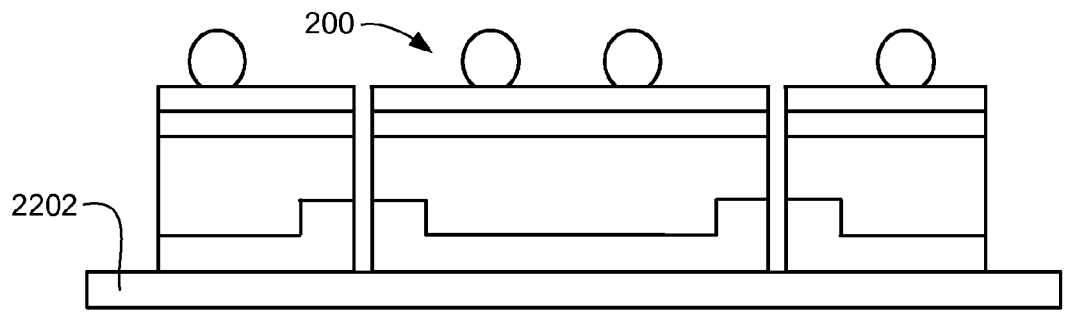
FIG. 30 is the structure of FIG. 26 in a pick and place phase.

Referring now to FIG. 30, therein is shown the structure of FIG. 26 in a pick and place phase. The singulation process forms a number of the integrated circuit package system 200 on the tape 2202. A pick and place handler (not shown) removes the integrated circuit package system 200 from the tape 2202 for further processing, such as cleaning and testing.

Figure 31:
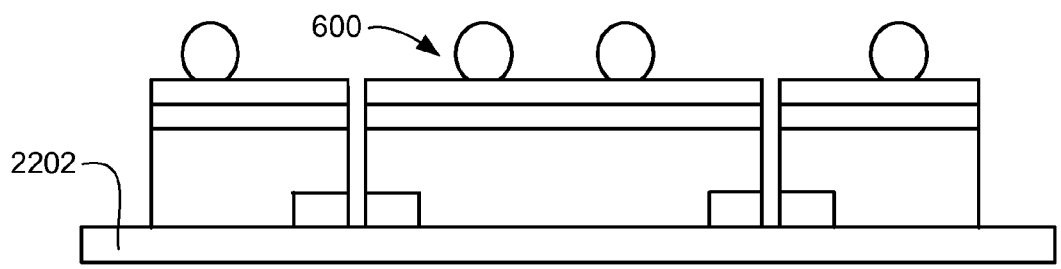
FIG. 31 is the structure of FIG. 27 in a pick and place phase.

Referring now to FIG. 31, therein is shown the structure of FIG. 27 in a pick and place phase. The singulation process forms a number of the integrated circuit package system 600 on the tape 2202. A pick and place handler (not shown) removes the integrated circuit package system 600 from the tape 2202 for further processing, such as cleaning and testing.

Figure 32:
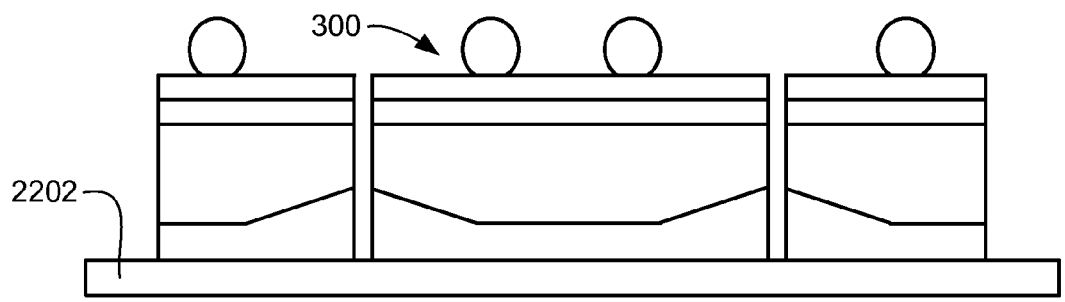
FIG. 32 is the structure of FIG. 28 in a pick and place phase.

Referring now to FIG. 32, therein is shown the structure of FIG. 28 in a pick and place phase. The singulation process forms a number of the integrated circuit package system 300 on the tape 2202. A pick and place handler (not shown) removes the integrated circuit package system 300 from the tape 2202 for further processing, such as cleaning and testing.

Figure 33:
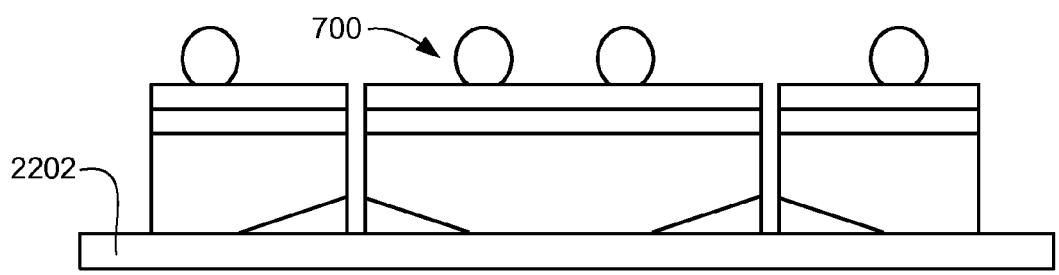
FIG. 33 is the structure of FIG. 29 in a pick and place phase.

Referring now to FIG. 33, therein is shown the structure of FIG. 29 in a pick and place phase. The singulation process forms a number of the integrated circuit package system 700 on the tape 2202. A pick and place handler (not shown) removes the he integrated circuit package system 700 from the tape 2202 for further processing, such as cleaning and testing.

Figure 34:
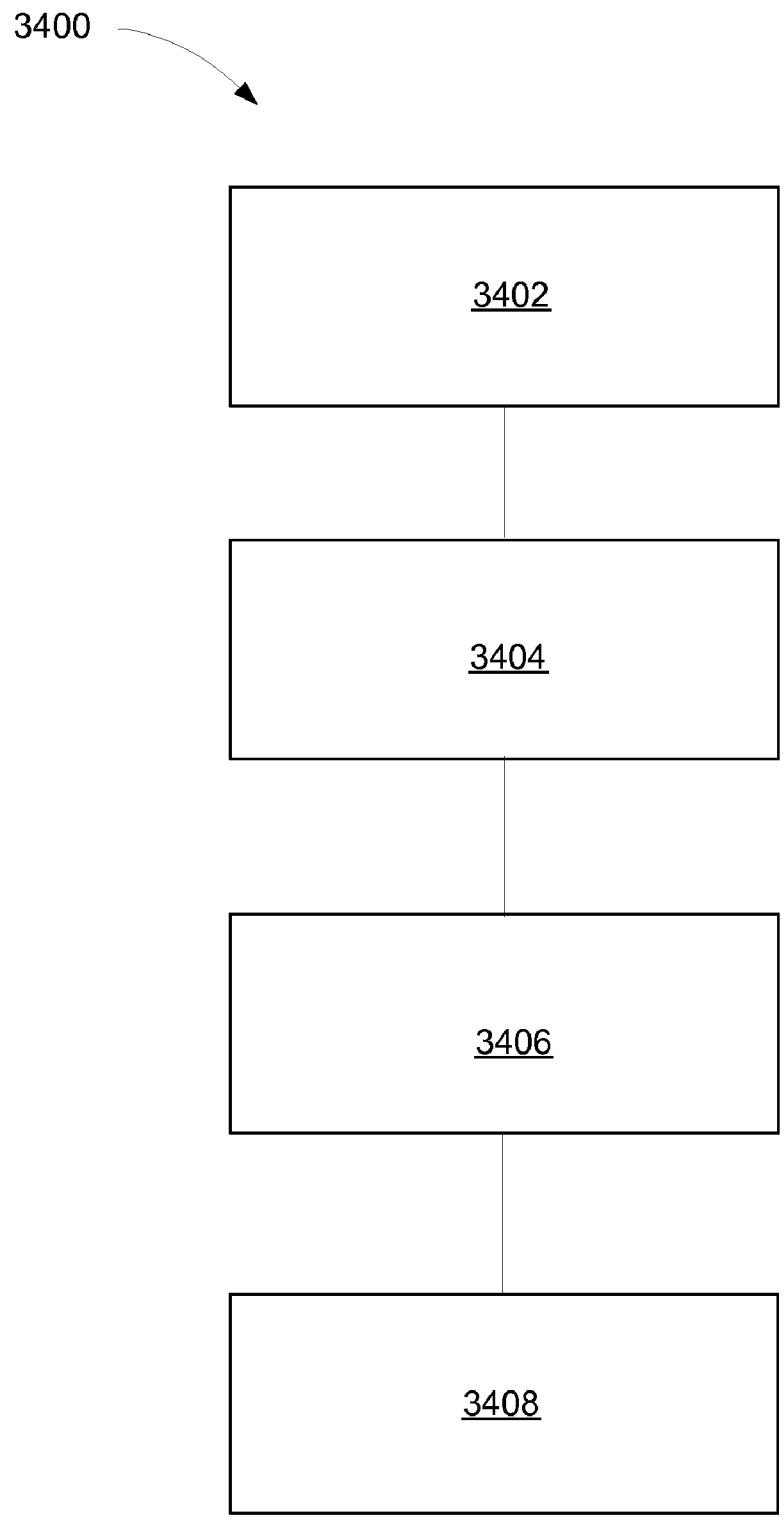
FIG. 34 is a flow chart of an integrated circuit package system for manufacture of the integrated circuit package system in an embodiment of the present invention.

Referring now to FIG. 34, therein is shown a flow chart of an integrated circuit package system 3400 for manufacture of the integrated circuit package system 100 in an embodiment of the present invention. The system 3400 includes forming a wafer having a back side and an active side in a block 3402; forming a recess in the wafer from the back side in a block 3404; filling the recess exclusively and completely with a cover in a block 3406; and singulating the wafer at the recess tilled with the cover in a block 3408

It has been discovered that the present invention thus has numerous aspects.

It has been discovered that the present invention provides a flexible low profile packaging system with increased warpage mitigation or thermal dissipation or a combination between the two for thin integrated circuit die while increasing yield during manufacturing.

An aspect is that the present invention provides a planar cover on the back side of a wafer. The planar cover fills recesses, such as notches or grooves, formed in the wafer from the back side. These filled recesses mitigate chipping or cracking of the integrated circuit dice during singulation of the wafer as well as handling of the singulated integrated circuit dice. After singulation, each of the integrated circuit die has the planar cover on the back side of the integrated circuit die as well as along the peripheral region of the back side.

Another aspect of the present invention provides the planar cover for planar rigidity of the wafer as well as the integrated circuit after thinning and singulation. The planar cover allows a more aggressive thinning of the wafer and the integrated circuit die.

Yet another aspect of the present invention provides a partial cover on the back side of a wafer. The partial cover fills recesses, such as notches or grooves, formed in the wafer from the back side. These filled recesses mitigate chipping or cracking of the integrated circuit dice during singulation of the wafer as well as handling of the singulated integrated circuit dice. After singulation, each of the integrated circuit die has the partial cover along the peripheral region of the back side.

Yet another aspect of the present invention provides the partial cover for planar rigidity of the wafer as well as the integrated circuit after thinning and singulation. The partial cover allows aggressive thinning of the wafer and the integrated circuit die while providing exposed back side for thermal dissipation Yet another aspect of the present invention provides the flexibility for different recess patterns, cover patterns, and cover thickness. The material for the cover may be varied to adjust for different planar rigidity, coefficient of thermal expansion, and shielding requirements.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for improving reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    forming a wafer having a back side and an active side;
    forming interconnects to the active side of the wafer;
    forming a recess in the back side of the wafer with the interconnects attached;

filling the recess exclusively and completely with cover and with a central region of the back side exposed to ambient; and singulating the wafer at the recess filled with the cover.

2. The method as claimed in claim 1 wherein forming the interconnects include attaching the interconnects on the active side.

3. The method as claimed in claim 1 wherein forming the cover includes covering the back side.

4. The method as claimed in claim 1 wherein forming the cover includes exposing the back side.

5. The method as claimed in claim 1 wherein forming the recess includes forming a vertical segment or a sloped segment in the wafer from the back side.

6. A method of manufacture of an integrated circuit package system comprising:

forming a wafer having a back side and an active side;
thinning the wafer from the back side;
forming interconnects to the active side of the wafer;
forming a recess in the back side of the wafer with the interconnects attached;
filling the recess exclusively and completely with cover and with a central region of the back side exposed to ambient; and
singulating the wafer at the recess filled with the cover.

7. The method as claimed in claim 6 wherein forming the interconnects includes attaching the interconnects on the active side.

8. The method as claimed in claim 6 wherein forming the cover includes filling a peripheral region from the back side with the cover.

9. The method as claimed in claim 6 wherein forming the cover includes filling a peripheral region from the back side and over the back side with the cover.

10. The method as claimed in claim 6 wherein forming the cover includes forming the cover comprised of a material having planar rigidity.

11. An integrated circuit package system comprising:

an integrated circuit die, having an active side and a back side, with a recess from the back side;
interconnects attached on the active side of the integrated circuit die; and
a cover to exclusively and completely fill the recess and with a central region of the backside exposed to ambient.

12. The system as claimed in claim 11 wherein the interconnects on the active side include solder balls.

13. The system as claimed in claim 11 wherein the cover to fill the recess is over the back side.

14. The system as claimed in claim 11 wherein the cover to fill the recess has a portion of the back side exposed.

15. The system as claimed in claim 11 wherein the recess has a vertical segment or a sloped segment.

16. The system as claimed in claim 11 wherein the integrated circuit die, having the active side and the back side, with the recess from the back side has a metal layer.

17. The system as claimed in claim 16 wherein the interconnects on the active side include solder balls.

18. The system as claimed in claim 16 wherein the cover to fill the recess is along the peripheral region from the back side.

19. The system as claimed in claim 16 wherein the cover is over a peripheral region from the back side and over the back side.

20. The system as claimed in claim 16 wherein the cover is comprised of a material having planar rigidity.

* * * * *